United States Patent
Carnegie et al.

(10) Patent No.: US 8,527,203 B2
(45) Date of Patent: Sep. 3, 2013

(54) METHOD FOR SELECTING WELL MEASUREMENTS

(75) Inventors: Andrew John Carnegie, Kuala Lumpur (MY); Benoit Couet, Belmont, MA (US); Michael Prange, Somerville, MA (US); William John Bailey, Somerville, MA (US); Ibrahim Pamir Bursin, Kuala Lumpur (MY); Stephen Flew, Kuala Lumpur (MY)

(73) Assignee: Schlumberger Technology Corporation, Sugar Land, TX (US)

( * ) Notice: Subject to any disclaimer, the term of this patent is extended or adjusted under 35 U.S.C. 154(b) by 955 days.

(21) Appl. No.: 12/127,436

(22) Filed: May 27, 2008

(65) Prior Publication Data

US 2009/0299636 A1    Dec. 3, 2009

(51) Int. Cl.
*G01V 9/00* (2006.01)
*G06F 19/00* (2011.01)
*G06G 7/48* (2006.01)

(52) U.S. Cl.
USPC .................................. 702/6; 703/10; 705/7.28

(58) Field of Classification Search
USPC ................... 702/6, 7; 703/2, 10; 705/7.28
See application file for complete search history.

(56) References Cited

U.S. PATENT DOCUMENTS

| | | |
|---|---|---|
| 5,148,365 A | 9/1992 | Dembo |
| 6,549,854 B1 | 4/2003 | Malinverno et al. |
| 6,980,940 B1 | 12/2005 | Gurpinar et al. |
| 7,054,752 B2 | 5/2006 | Zabalza-Mezghani et al. |
| 2003/0225606 A1 | 12/2003 | Raghuraman et al. |
| 2005/0096893 A1 | 5/2005 | Feraille et al. |
| 2007/0179768 A1 | 8/2007 | Cullick et al. |
| 2007/0192072 A1 | 8/2007 | Cullick et al. |

OTHER PUBLICATIONS

Tatang, M.A., et al., An efficient method for parametric uncertainty analysis of numerical geophysical models, Journal of Geophysical Research, Sep. 1997, vol. 102, No. D18. pp. 21,925-21,932.
Manceau, E., et al., Use of Experimental Design Methodology to Make Decisions in an Uncertain Reservoir Environment—From Reservoir Uncertainties to Economic Risk Analysis, OAPEC Seminar, Jun. 2001, Rueil, France. pp. 1-12.
Barber, A., et al., Optimizing Production from Reservoir to Process Plant, Oilfield Review, Winter 2007/2008, vol. 17, No. 4, pp. 18-29.
International Search Report of PCT Application Serial No. PCT/US2009/044663 dated Jan. 20, 2010.

*Primary Examiner* — John H Le
(74) *Attorney, Agent, or Firm* — Colin Wier; Rodney Warfford

(57) ABSTRACT

A method of determining a selection of well measurements and/or their respective control parameters is described based on a global target having predetermined sensitivities to a multitude of uncertainties associated with input variables to a model including the step of ranking measurements and control parameters in accordance with their capability to reduce the uncertainties of input variables identified as most sensitive input variables through simulations using the model or a reduced variant of the model.

11 Claims, 6 Drawing Sheets

METHOD FOR SELECTING WELL MEASUREMENTS

FIELD OF THE INVENTION

The invention relates to methods for selecting well measurements and their parameters. More specifically, the invention relates to methods for selecting well measurements and their parameters in view of a target function derived from a model.

BACKGROUND

During the production life cycle of oil and gas extraction from reservoir fields in geological formations, certain stages are followed which include exploration, appraisal, reservoir development, production decline, and abandonment of the reservoir. Important decisions must be made at each of these stages in order to properly allocate resources and to assure that the reservoir meets its production potential. The planning and the decisions are typically part of a process referred to as a Field Development Plan (FDP).

In the early stages of the production life cycle, one begins with almost complete ignorance about the distribution of internal properties within the reservoir. As development continues, diverse types of reservoir data are collected, such as seismic, well logs, and production data. These reservoir data are combined to construct an evolving understanding of the distribution of reservoir properties in an earth formation. This understanding is key to making proper reservoir management decisions.

As oil and/or gas is extracted from the reservoir, new data are obtained and the goals and development plans for managing the reservoir are periodically re-evaluated to maximize production of oil and/or gas from the reservoir. As the reservoir is depleted, the goals and field development plans are changed, and eventually the reservoir is abandoned.

Various prior art approaches the oil and gas industry has taken to reservoir management have been reported in numerous books and technical journal articles. Methods which describe the use of a reservoir model in combination with experimental design techniques to determine the sensitivity of production plans to the uncertainty associated with technical parameters are described, for example, in published U.S. Patent Application No. 2005/0096893 to M. Feraille et al. and U.S. Pat. No. 7,054,752 to 1. Zabalza-Mezghani et al.

Co-owned U.S. Pat. No. 6,549,854 to A. Malinverno and M. Prange describes model-consistent update strategies for subterranean reservoirs taking into account uncertainties of measurements. Co-owned U.S. Pat. No. 6,980,940 to O. Gurpinar et al. and published U.S. Patent Application No. 2003/0225606 to B. Raghuraman and B. Couet together with the literature cited therein describe many detailed steps relevant to current reservoir optimization methods.

More recently published U.S. Patent Application No. 2007/0192072 to A. S. Cullick et al describes methods to optimize field production using reservoir simulators and proxy models to determine sensitivities of control parameters and future settings of control parameters.

The prior art described above relates mostly to production optimization and the placement and use of fixed installations or assets. However, in the course of assessing and producing hydrocarbon bearing formation and reservoirs, it is important to acquire knowledge of formation and formation fluid properties which influence the productivity and yield from the drilled formation. Typically such knowledge is acquired by mobile tools and methods generally referred to as "logging".

Logging operations generally include the measurement of a formation parameter or formation fluid parameter as a function of location, or more specifically depth in a wellbore. Formation logging has evolved to include many different types of measurements including measurements based on acoustic, electromagnetic or resistivity, and nuclear interactions, such as nuclear magnetic resonance (NMR) or neutron capture, or mechanical forces as generated by the flow through the well and the production tubing.

Another form of logging tool is known as a formation sampling device and is designed to take samples of formation fluid at one or more depth points. A representative example of such a sampling device is the MDT™ tool of Schlumberger.

It is further well established to mount logging tools on either dedicated conveyance means such as wireline cables or coiled tubing (CT) or, alternatively, on a drill string which carries a drill bit at its lower end. The latter case is known in the industry as measurement-while-drilling (MWD) or logging-while-drilling (LWD). In MWD and LWD operations, the parameter of interest is measured by instruments typically mounted close behind the bit or the bottom-hole assembly (BHA). Both logging in general and LWD are methods known as such for several decades and hence are believed to require no further introduction.

In addition to the logging measurements described above, it is possible to test the performance of a well using flow measurements conducted at the surface.

At present, any of the above logging and well test measurements are chosen by an operator based on experience and are only loosely correlated to a field development plan or an objective function based on the field development plan In view of the known art, it is therefore seen as one object of the invention to improve and enhance methods for selecting logging and well testing tools and methods in an automated or semi-automated manner.

SUMMARY OF INVENTION

According to a first aspect of the invention, a method of determining a selection of well measurement is provided based on an objective function having predetermined sensitivities to a multitude of uncertainties associated with input variables to a model, including the step of ranking measurements and control parameters in accordance with their capability to reduce the uncertainties of input variables identified as most sensitive input variables through simulations using the model or a reduced variant of the model.

Well measurements and/or their respective control parameters may include well and surface measurements close to the wellhead, preferably measurements known as logging and well testing measurement, and more preferably measurements executed through non-stationary instruments.

Non-stationary instruments are instruments which remain at the well site during the measurement but are dismantled or removed after the measurement. Non-stationary instruments are not part of the well completion installation. A control parameter is a changeable parameter, the value of which is typically chosen by the operator before or during the measurement to improve the result of the measurement. In the description below, the reference to a measurement may include any of its respective control parameters, a combination of measurements and/or their respective control parameters.

A model is a set of instructions for a processor designed to simulate the result of a process or methods applied to a reservoir or well represented by the model.

The importance of measurements and control parameters are preferably ranked in accordance with sensitivities to uncertainties of the most sensitive input variables. Thus the measurements can be preferably selected in a manner which is optimized in view of reducing the uncertainty in those input variables which have been determined as the most sensitive for the calculation of the global target.

In a preferred embodiment, the measurements and control parameters are ranked in accordance with sensitivities to uncertainties of the most sensitive input variables by simulating the result of the measurement using the model or a reduced variant of the model. In this embodiment, the sensitivity of a measurement is established by simulating its result in a model which is either equal or equivalent to the model used to simulate the value of the objective function. An equivalent model is preferably a model reduced in complexity and hence run time when run on the same computing equipment as the full model but which remains responsive or sensitive to at least the most sensitive input parameters of the full model.

In a preferred embodiment, the measurements and control parameters are ranked by comparing the sensitivities to a multitude of uncertainties associated with input variables to a model for the objective function with the sensitivities to a multitude of uncertainties associated with input variables to a model for the result of the measurements.

In a preferred embodiment, the objective function is derived from a field development plan of a hydrocarbon reservoir.

In a preferred embodiment, the model includes a model of a hydrocarbon reservoir.

In a further preferred embodiment, the predetermined sensitivities are calculated using the step of varying the input parameters within their respective ranges of uncertainty and determining how the objective function varies accordingly. The methods to choose the specific values of the input parameters within their specific ranges of uncertainties can include experimental design or Monte-Carlo methods.

Further details, examples and aspects of the invention will be described below referring to the drawings listed in the following.

DETAILED DESCRIPTION

Figure 1:
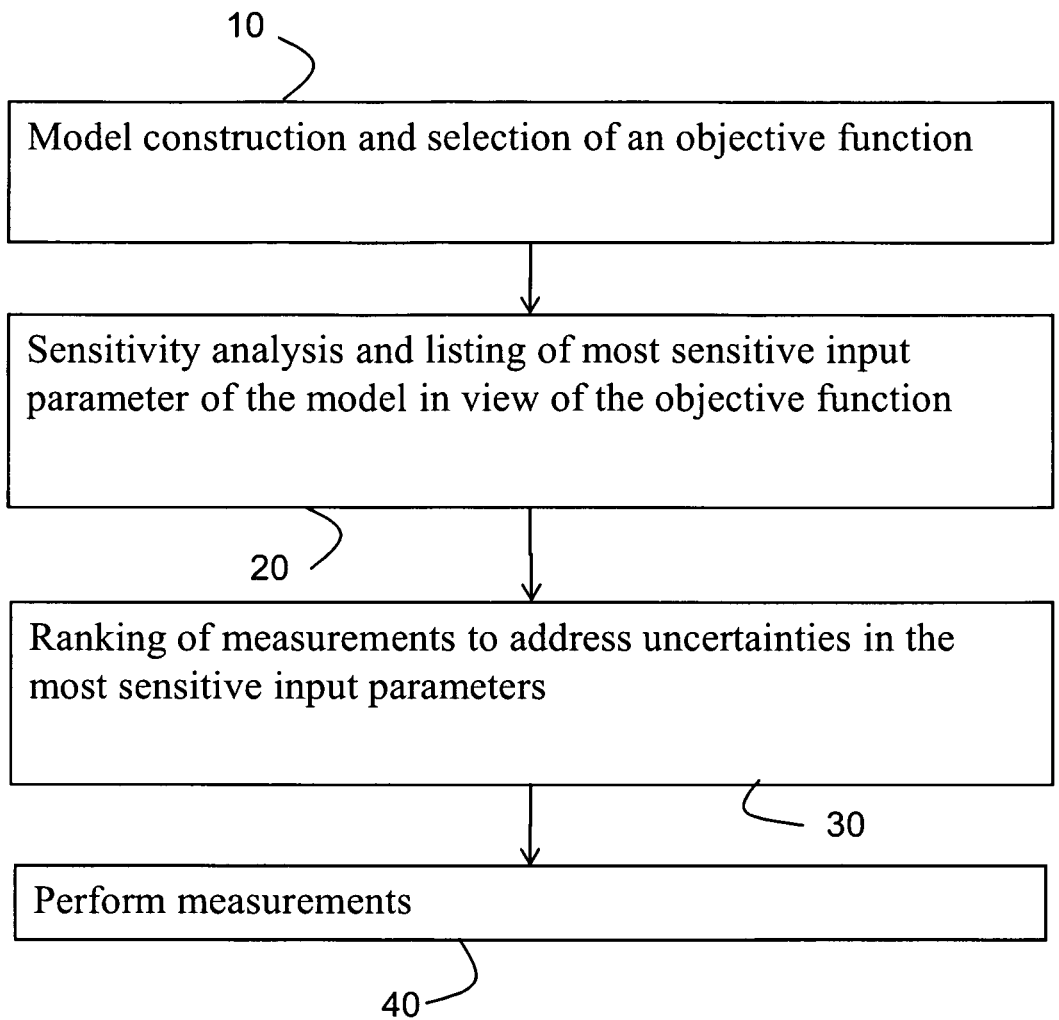
FIG. 1 is a flowchart including basic steps in accordance with an example of the present invention.

In the following example, the existence of a subterranean reservoir is assumed together with knowledge of a sufficient number of input parameters to build a computer-based model of the reservoir. It is assumed that a range of uncertainty is known or estimated for each input parameter. Any input parameter may either be an uncontrollable parameter or a controllable parameter.

Uncontrollable parameters describe entities which will not be directly altered (but may sometimes be measured) by man in the reservoir being studied. For example, almost every reservoir property, such as porosity and water saturation may be considered as uncontrollable. Controllable parameters will be directly controlled by man. For example, the position of a well in a reservoir, the location of perforations and the duration of time that the well produces hydrocarbons. The following example refers predominantly to the uncontrollable input parameters of a model.

A major objective in running the model will be to determine those uncontrollable parameters which when varied in their respective ranges of uncertainty, can cause a significant variation in the predictions of the model, since such parameters may need further measurements to reduce their associated ranges of uncertainty. Many of the uncontrollable parameters required to build a reservoir model can typically be obtained from a combination of seismic, logging and well testing measurements, which are collectively referred to as logging measurements. These measurements may be made on the field to be modeled, or on fields which are considered to be analogous to the field to be modeled. The term measurement refers to the method of the measurement together with the specific values chosen for the control parameters used in performing the measurement.

The building of such models from measurements is a standard task. In a typical model building process, the measured data are combined either directly or after further interpretation to form a static model of the reservoir. The static model builder PETREL™, commercially available from Schlumberger, is for example capable of integrating geological data and a number of standard logging data. Further logging data mainly related to the reservoir fluid properties are tied to the static model in a dynamic model builder as commercially available from Schlumberger as ECLIPSE™. The dynamic reservoir model can then be used for performing simulations to obtain the likely values of a parameter of interest such as the cumulative oil production CUMOIL (t) in a defined period of time t.

Dependent on the specific nature of the parameter of interest the reservoir model may have to be combined with further models which simulate for example the production gathering system or even the processing of hydrocarbons into base chemicals. Such models are also commercially available as PIPESIM™ offered by Schlumberger or HYSISOR of Aspen Technology, Inc. A further description of available simulation methods can be found for example in a publication by A. Barber et al. "Optimizing Production from Reservoir to Process Plant" published in the Oilfield Review, Winter 2007/2008, pp. 18-29 (2008), incorporated herein by reference. For the purpose of the invention, the complete model is herein referred to as an engineering model and may be a combination of several models.

Figure 2:
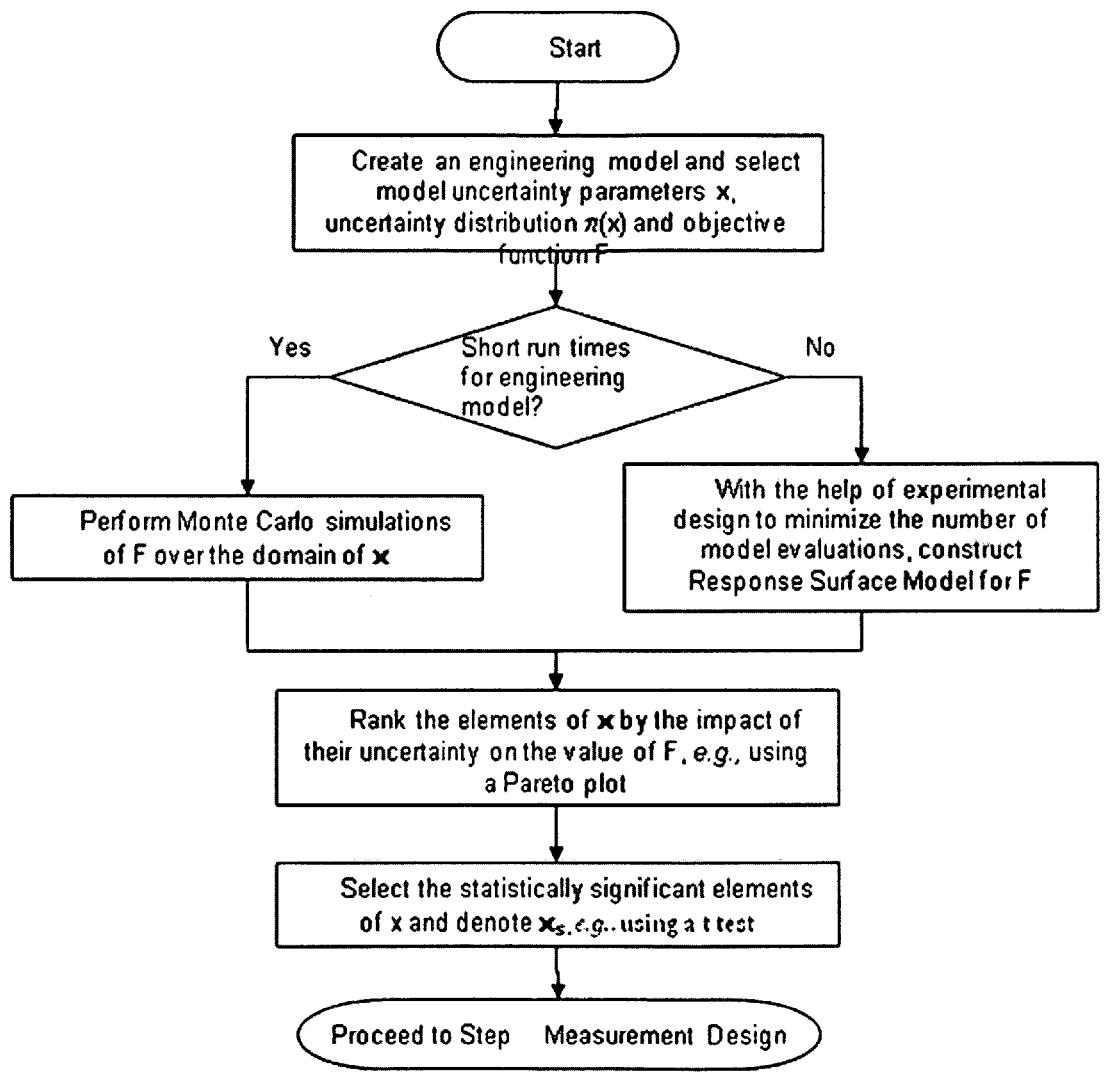
FIG. 2 illustrates steps of a sensitivity analysis in accordance with an example of the present invention.
Figure 3:
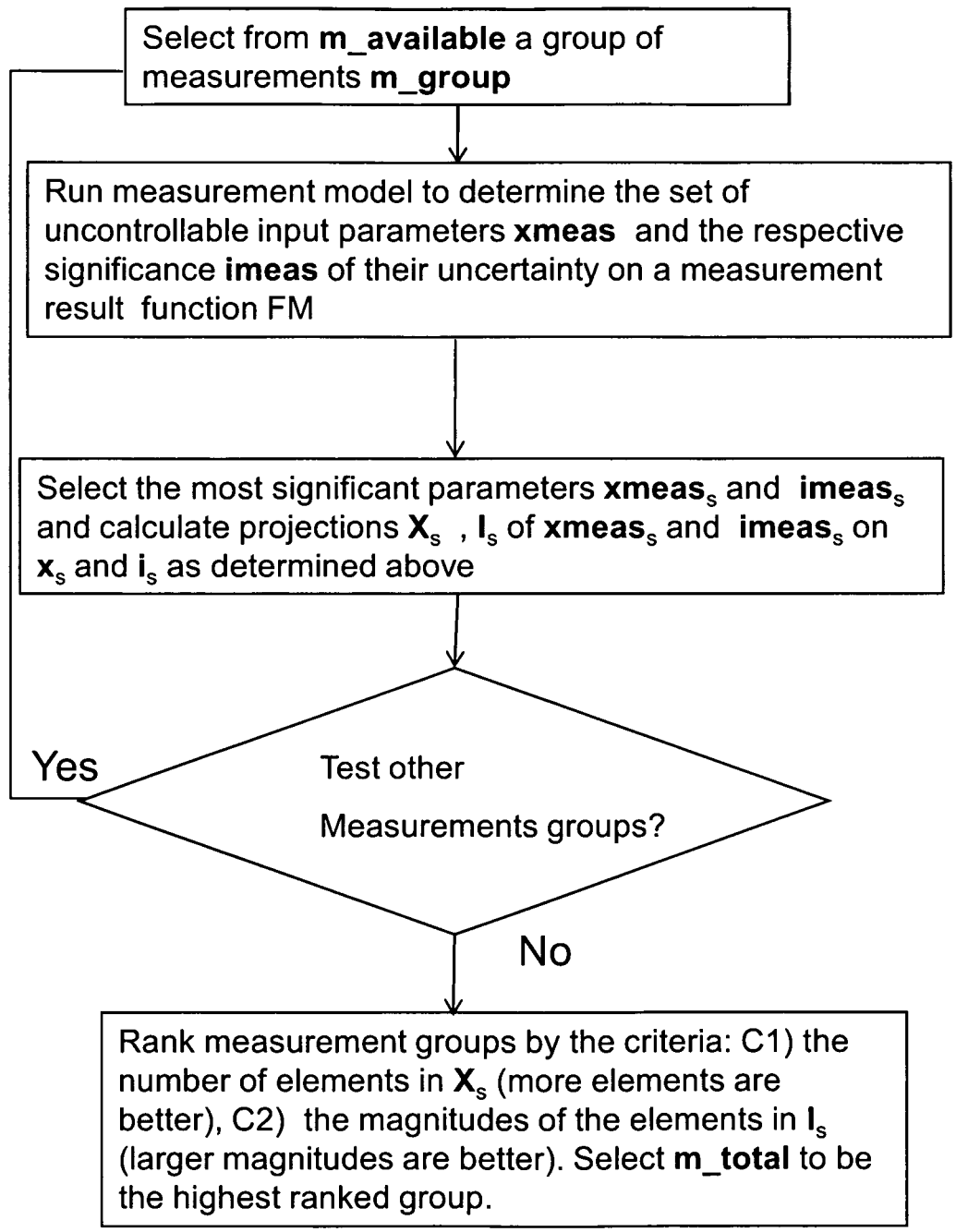
FIG. 3 illustrates a measurement selection process in accordance with an example of the present invention.
Figure 4:
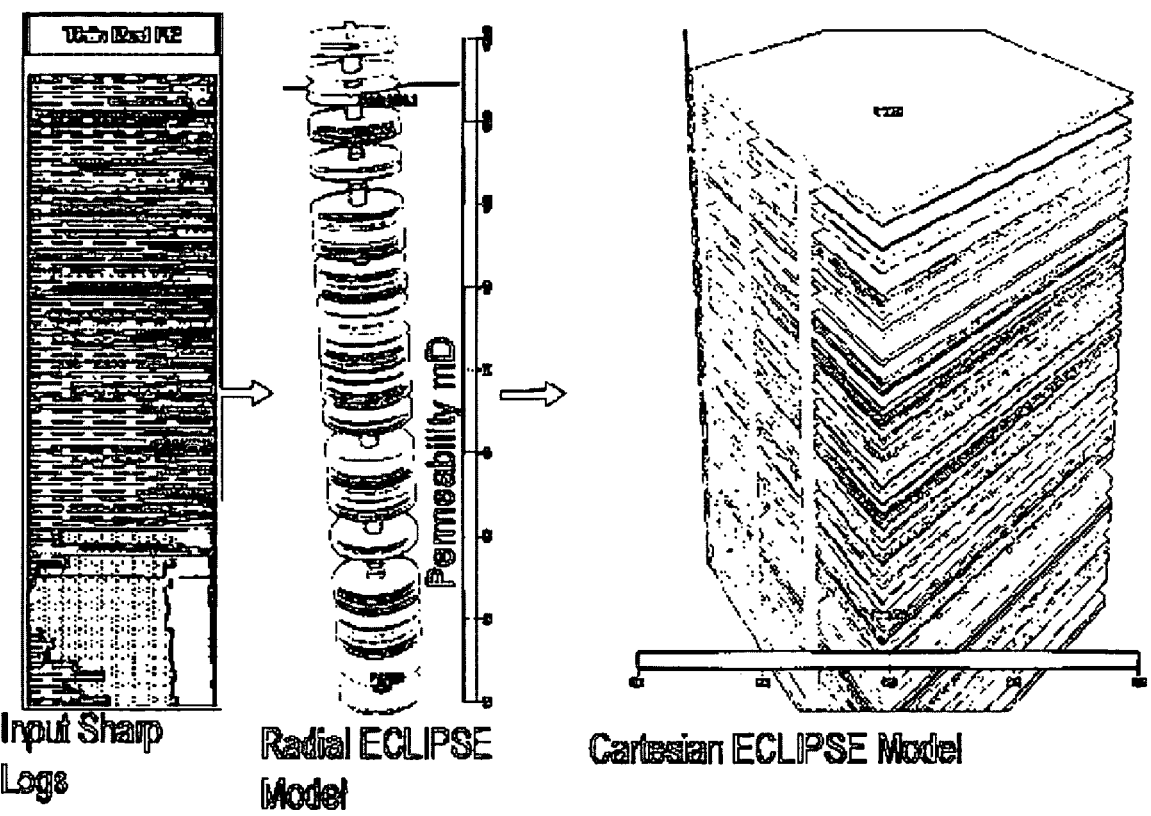
FIG. 4 is a known example of a thin bed reservoir for use in an application of the present invention.

With the above assumptions, general steps in accordance with an example of the invention are shown in FIG. 1 with further details illustrated in FIGS. 2 and 3.

In step 10 (model construction), an engineering model is built using for example PETREL and ECLIPSE. In this step uncertainties are assigned to input parameters to the model, reflecting for example uncertainties in the logging measurements, layer thickness, the location of geological features such as faults and other input parameters.

An objective or cost function is then selected or defined. The objective function, denoted by F returns a value that quantifies the most important ranking criterion in a project. In a field development plan (FDP), the objective function can be represented for example by the cumulative oil production in a time period of t CUMOIL(t), net present value (NPV), monthly cash flow or similar parameters. Further details on objective functions and their use for reservoir planning can be found for example in published U.S. Patent Application No. 2003/0225606, incorporated herein by reference.

In this example, only one FDP is considered which is taken to be common across all reservoir scenarios to be analyzed. This means that the controllable input parameters of the engineering model are also fixed across all reservoir scenarios. The engineering model of the present example is capable of computing reservoir performance results, denoted by the vector r, needed to compute the objective function F. The set of uncontrollable input parameters to the model are described with a vector x whose elements adjust aspects of the model including, but not limited to, geometry and material properties.

The uncertainties in the elements of x are assumed in this example to be uncorrelated. The occurrence of correlated parameters can be accommodated by using for example principal component analysis to define uncorrelated parameters x in terms of the original correlated parameters.

In step 20 (sensitivity analysis) of FIG. 1 also described in more detail in FIG. 2, sensitivity analysis is used to identify the subset of the parameters in x whose uncertainties, whether acting jointly or in a singular manner, are likely to have a significant impact on the uncertainty in the predicted value of F. This subset of parameters can be called the significant uncontrollable input parameters of F, and be denoted by the vector $x_s$. As illustrated in FIG. 2, the sensitivity analysis uses for example Response Surface Modeling, to generate a Pareto chart, which also ranks how the uncertainty in the model parameters x, impact the uncertainty in the objective function F. i is defined as the vector of these impacts.

One way to view i is that is describes the sensitivities of the predicted value of F to the individual components in x. Therefore, it is referred to as the sensitivities vector of F to x. In the subsequent analysis, $x_s$ is used instead of x in order to focus attention on the most important reservoir parameters and to reduce the number of engineering model evaluations required to predict F. The vector $i_s$ (subset of i) is the sensitivities vector of F to $x_s$, and the components of $i_s$ are ordered in terms of decreasing magnitude, and, hence, the respective items of $x_s$ are ordered accordingly (so for example, the first component of $x_s$ is the most significant uncontrollable input parameter).

The choice of the methods to perform the sensitivity analysis depends largely on the complexity of the engineering model and the available computing power. As for the example illustrated by FIG. 2, when the engineering models can be computed quickly, $x_s$ can be directly sampled by Monte Carlo techniques. Otherwise, $x_s$ is more sparsely sampled by methods such as experimental design as incorporated into the ECLIPSE product as COUGAR™ and described in a publication at the OAPEC Seminar, 26-28 Jun. 2001, Rueil, France by E. Manceau et al. with the title "USE OF EXPERIMENTAL DESIGN METHODOLOGY TO MAKE DECISIONS IN AN UNCERTAIN RESERVOIR ENVIRONMENT—FROM RESERVOIR UNCERTAINTIES TO ECONOMIC RISK ANALYSIS" incorporated herein by reference. The impact of the uncertainties on the reservoir models is evaluated by such techniques using response surface modeling.

Other advanced mathematical modeling techniques such as proxy models or polynomial chaos as described by Tatang, M. A., Pan, W., Prinn, R. G. and McRae, G. J. in: "An efficient method for parametric uncertainty analysis of numerical geophysical models", Journal of Geophysical Research, 102, D18, 1997, can be applied to reduce the cost of or time required for running multiple simulations. In step 30 (measurement design and selection) of FIG. 1, and described in more detail in the flowcharts of FIG. 3, an ordered set of measurements, denoted by the vector m_total, is designed to reduce the uncertainty in F to an acceptable level, by way of reducing the uncertainty in the elements of $x_s$, and hence reduce the magnitudes of the corresponding elements of $i_s$. Ideally, after the set of measurements m_total have been applied, the remaining uncertainty in the predicted value of F should be suitable for decision making within the accepted risk tolerance. To assist in selecting appropriate measurements, the elements of $x_s$ are ordered by the impact that their uncertainties have on the uncertainty in the predicted value of F, e.g., using a Pareto chart from the previous step.

In this step 30 of the example as illustrated by FIG. 3, a list m_available, of all available measurements is determined. Such a list can include for example a subset of all known well test measurements and logging measurements including the ranges of important control parameters of such measurements. It should be understood that the list m_available also includes combinations of these measurements, and that a measurement is only allowed if it is expected to be safe. The list represents all possible known measurements which can be applied to reduce the uncertainties identified as significant in the previous step 20.

As shown in FIG. 3, a group of measurements, m_group, is selected from the set m_available. A group, m_group can be any combination of one or more measurements and their respective control parameters. It is assumed that a model (called the "measurement model") exists which may be used to predict (i.e. simulate) the objective function FM, of the measurements. The objective function FM can be any modeled result of the measurement or abstract function which depends on the measurements. After the measurements have been made, the uncontrollable input parameters of the measurement model will be manipulated so the just mentioned model successfully predicts the recordings of the objective function. FM can be a weighted sum of the individual measurements in m_group. The choice of weights of the sum is case specific.

The measurement model may itself be a collection of individual models. For example, there is a measurement model, called $M_{interference+gamma\_ray}$, to predict $\Delta P+\gamma$, where $\Delta P$, predicted by an interference test model, is the pressure disturbance that would be recorded by a pressure gauge placed at some location A, in the reservoir, caused by fluid withdrawal from another location B, in the reservoir and $\gamma$, predicted by a model of formation radioactivity, is the intensity of gamma rays that would be measured at location B.

The measurement model (for example $M_{interference+gamma\_ray}$) can be an engineering model, which predicts the value of F (referred to above), but is generally not necessarily the same model. Often it is faster to use a measurement model which is simplified compared to the engineering model. A vector xmeas is assigned to be the set of uncontrollable input parameters for the measurement model, and the vector imeas to be the sensitivities vector of FM to xmeas. Further, the vector $xmeas_s$ is defined as the set of significant uncontrollable input parameters for the measurement model and $imeas_s$ as the corresponding sensitivities vector. $X_s$ is defined as the vector of elements of $xmeas_s$ which are also elements of $x_s$ or in more abstract terms the projection of $xmeas_s$ onto the vector of significant uncontrollable input parameters $x_s$ of the engineering model and $I_s$ is defined as the corresponding sensitivities vector of $X_s$. In an extreme case, the group of measurements, m_group, can be considered to be useless if $X_s$ (and hence $I_s$) is the null vector.

As shown in FIG. 3, all possible groups of measurements are ranked in terms of goodness against the following criteria: C1) the number of elements in $X_s$ (more elements are better); C2) the magnitudes of the elements in $I_s$ (larger magnitudes are better); and C3) the total expected cost, COST, of the measurements must be less than the budgeted cost, BUDGET (smaller COST is better). The specific manner in which the criteria are applied depends upon the case being studied. But it can be said that a group of measurements which is sufficiently good to be chosen as m_total will generally be one in which $X_s=x_s$, $I_s=i_s$, and COST<BUDGET. The highest ranking group of measurements is selected as m_total.

In the absence of any other constraint on the selection, the operator ensures that the uncertainty of the objective function F is addressed most effectively through the inversion of the measurement model: when the measurement model associated with m_total is inverted so that it reproduces the objective function FM obtained by applying the measurements in m_total, the selection process ensures that the inversion is most sensitive to the parameters which dominated the calculation of the objective function F. Thus after the inversion, the engineering model is updated with newly calculated values of the parameters in $x_s$.

It is seen as an advantage of this variant of the invention that from a list of potential measurements and their respective control parameters those are selected that have the highest sensitivity to the same parameters to which the objective function F is sensitive.

It can be easily seen that the list of measurements can be reduced or enlarged depending on a pre-selection process based for example on the nature of the parameters in $x_s$. Such a pre-selection process can eliminate measurements known to have no relevance to the sensitive input parameters $x_s$ based on prior knowledge and hence accelerate the selection as described in FIG. 3.

It is envisaged that the computation costs of the method can be decreased by the use of proxy models as for example suggested for a different purpose in the published U.S. Patent Application No. 2007/0192072 cited above. The proxy models useful for the present invention can be designed to reproduce solely the sensitivity of the measurements to the parameters of $x_s$. Using such a reduced simulation of the measurement with proxy models removes the requirement to simulate the results of the measurement with the full engineering model.

Once a preliminary group of measurements, is selected to deal with a vector $x_s$ of significant uncontrollable parameters, the measurements can be ordered by their expected value. The method of calculating the value of a measurement is dependent to the decision making process involved in a FDP, and so is FDP dependent. It is however not required to have a direct monetary measure for the value. For example, the value of a measurement might be related to the reduction in the uncertainty of F achievable after making the measurement. It is clear from the above definition that a monetary value is not required and F may not be linked to any monetary definition.

An example of an economic measure of the value of a measurement is its Value of Information, VoI: this is the difference between the expected economic value of the FDP with the information and without the information, minus the cost of acquiring the information It is worth noting that within the group m_total, the measurements can be ordered in accordance with their value, and hence, that their execution can be performed in order of decreasing measurement value. It is seen as an advantage for an operator facing the task of ordering and scheduling well measurements that a sequence of measurements can be pre-defined using this variant of the present invention.

In this variant COST and BUDGET are defined and to keep COST, the total cost of measurements, within BUDGET, the allocated budget, the measurements with the lowest value in the group will not be performed if their associated cost causes the cumulative measurement cost to exceed the allocated budget. After ensuring that COST≦BUDGET, the final list consisting of K significant uncontrollable parameters which are to be addressed by measurements is denoted by the vector xmf, and for K parameters are described by the probability density function $\pi(xmf)=\pi_1(xm1_1)\pi_2(xmfx_2)\ldots\pi_K(xmf_K)$.

The following step 40 (measurement execution) of FIG. 1 relates to the execution of the measurements. The stream of measurements is monitored during or after the execution to determine their impact on reducing the uncertainty in the objective function. As the measurements are performed, the stream of measurements is monitored to detect two conditions:

Condition A—the information gathered thus far has a significant impact on the uncertainty of F.

Condition B—an event has occurred that necessitates termination of the pre-planned measurement program.

If condition A is detected, then the uncertainties $\pi(xmf)$ are updated by the measurements and steps for sensitivity analysis and measurement design are repeated to determine an updated optimal data acquisition program. If condition B above is detected, then the measurement program planned in the step for measurement design is terminated, and a new plan is devised.

In the following a illustrative example of the present invention is described making reference to FIGS. 4, 5, 6A, and 6B.

A thinly laminated oil reservoir in deep water is tested to determine the volume of oil, CUMOIL, that can be produced over three years from a single well drilled at the crest of the reservoir. The CUMOIL is assumed to be the asset owner's proxy for ENPV, the Expected Net Present Value from the Field Development Plan at a particular time T.

The method of steps 10 and 20 mentioned above are applied for the following purposes:

to identify which uncertainties can potentially affect the predictions of CUMOIL, to design the well test that will reduce these uncertainties to a manageable level.

The potential effects of the uncertainties are derived from an ECLIPSE model. The model is based on the log measurement shown on the left panel of FIG. 4. The log measurements indicate a very thin layering. This thin layering is preserved in the cylindrical ECLIPSE simulation model (center panel of FIG. 4) and in the Cartesian ECLIPSE model (left panel of FIG. 4).

A run of the model investigates the effects of uncertainty in the following input parameters x to the model on the predictions of the objective function CUMOIL:

Pinchouts of Individual Sand Laminations away from the well bore

Vertical Communication Between Laminations

Horizontal permeability of laminations

Porosity of sand laminations lies between 24% and 26%

NTG (net to gross) has an uncertainty between 7.5% and 15%

The viscosity of oil is between 0.3 cp to 0.8 cp

Flowing Bottom Pressure Limit, WBHPF, is between 5300 psi to 6000 psi

Dip of reservoir layers is between 0 and 5 degrees.

The uncertainty in flowing WBHPF limit is a surrogate for uncertainty in the following parameters: bubble point pressure ($P_{bub}$), asphaltene precipitation pressure ($P_{asphaltene}$) and sanding pressure ($P_{sanding}$). There is no water or free gas in the ECLIPSE model.

Figure 5:
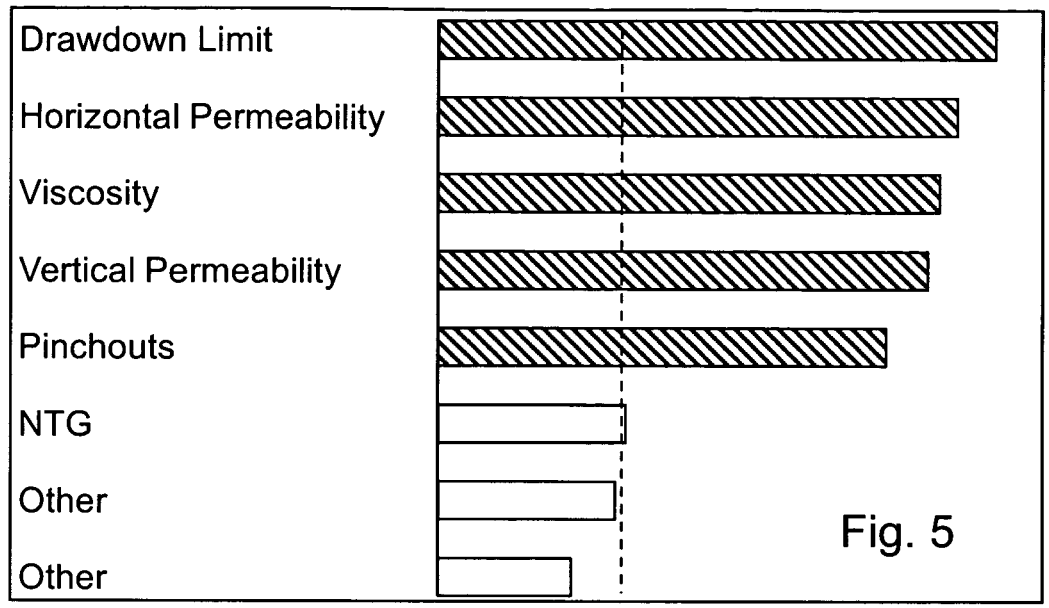
FIG. 5 is a Pareto chart for a objective function in an application of the present invention.
Figure 6A:
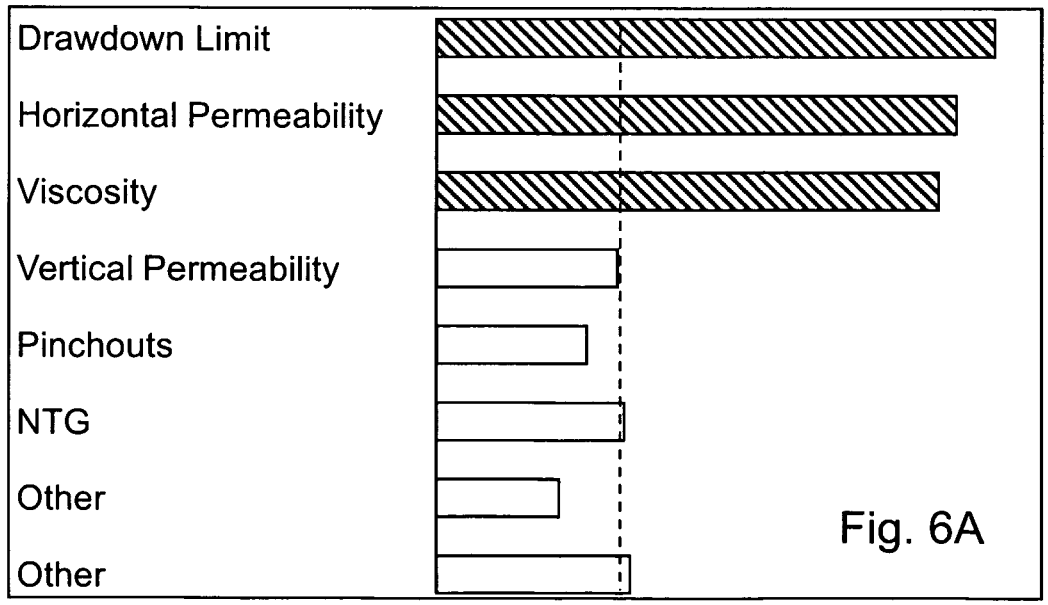
FIGS. 6A and 6B are Pareto charts illustrating the selection of measurement parameters in the application of the invention.
Figure 6B:
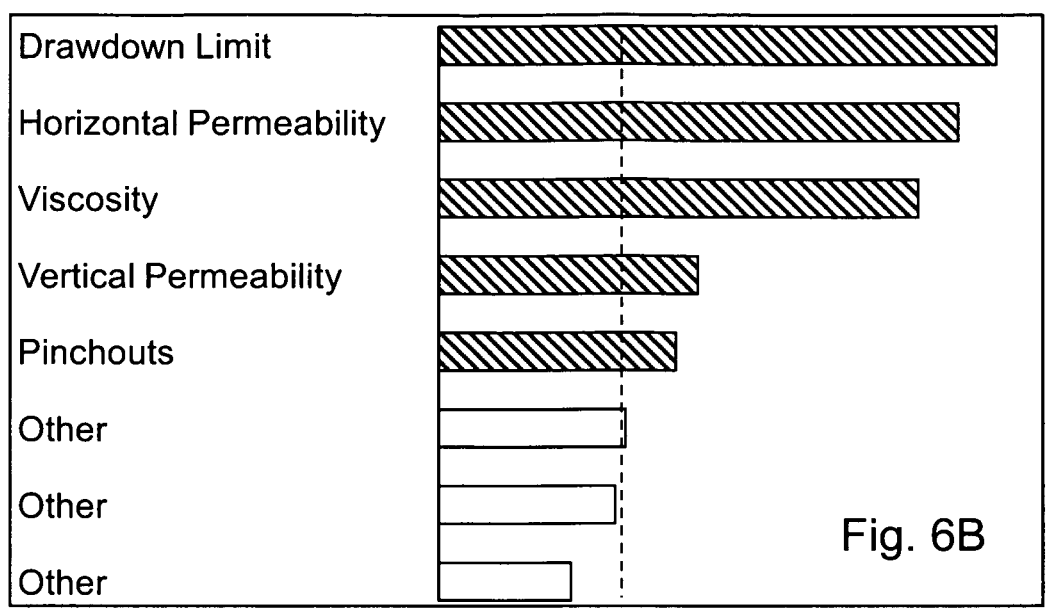

The sensitivity analysis of step 20 above using the COUGAR module inside ECLIPSE is used to generate the Pareto chart shown in FIG. 5. The Pareto chart ranks the model input parameters in accordance to the impact their respective uncertainty has on the calculation of CUMOIL. The chart of FIG. 5 may be used to determine which model input parameters $x_s$ are sufficiently significant such that, by reducing their uncertainty through further measurements, it can be expected that the uncertainty of the CUMOIL value calculated will be reduced by reducing the uncertainty of the model input parameters $x_s$ through further measurements. By the same measure, the ranking can be used to eliminate those model input parameters which would not contribute significantly to reducing the uncertainty from the list used to determine the required further measurements. A dashed line is used to indicate the threshold between significant and insignificant input variables.

The Pareto chart of FIG. 5 shows that for the present example the uncertainties impacting CUMOIL most are: WBHPF, viscosity, vertical permeability, horizontal permeability and the rate of pinch-outs of sand laminations. The chart indicates that uncertainty in porosity, NTG and layering dip will not affect the uncertainty in predictions of CUMOIL significantly enough to warrant a dedicated measurement program to reduce their particular uncertainties.

In this example, logging measurements to acquire data to reduce uncertainty in WBHPF and viscosity can be obtained by selecting for example a formation sampler such as the MDT designed to either measure these parameters directly while sampling or in a testing laboratory at surface.

Whilst the above selection of the MDT as logging measurement can be directly derived from the ranking in the above Pareto chart, it is seen as an even more important feature of the present invention that a combination of measurements and their optimized control parameter settings m_total can be derived in an optimized manner. This feature of the invention is demonstrated in the following. For the sake of clarity, in the following m_available is reduced to select a control parameter T (time of test) for a single measurement, which is a well test.

For this example, the well test measurement is the cumulative oil produced CUMOIL_WT. For it to be a relevant measurement, the uncertainty in this quantity should be sensitive to Vertical Permeability, Horizontal Permeability, rate of pinch-outs of sand laminations, hence display a similarity in the sensitivity to uncertainty of CUMOIL. It was found that the closer the similarity in the uncertainty sensitivities the likelier it is that a measurement can usefully constrain interpretations of the above mentioned reservoir model input parameters.

The results of the well test CUMOIL_WT while varying the control parameter T are simulated using the same model as for the calculation of CUMOIL and the same uncertainty in the input parameters. Applying again the COUGAR module, Pareto charts are generated for CUMOIL_WT(2 days), which represents the oil produced performing the well test for two days and for CUMOIL_WT(100) as FIGS. 6A and 6B, respectively. When comparing the sensitivities as calculated with the sensitivities of the COMOIL of FIG. 5, the CUMOIL_WT(100) has a higher sensitivity to vertical permeability and the effects of pinch-outs than the CUMOIL_WT(2 days). Based on the better match of sensitivity and provided there are no further constraint on the selection, the analysis shows that the well test for more than 100 days, CUMOIL_WT(100) has a better match of sensitivity to the uncertainties of CUMOIL than CUMOIL_WT(2).

As a result of this modeling, it can be expected that if a CUMOIL_WT(2) measurement is performed and the engineering model is updated or inverted to match the results, the uncertainty in vertical permeability and the effects of pinch-outs will not be significantly reduced. On the other hand, performing a model inversion to match a CUMOIL_WT(100) measurement would significantly decrease the uncertainty in vertical permeability and the effects of pinch-outs. A good choice for m_total is hence CUMOIL_WT(100).

Many alterations and modifications of the foregoing will no doubt become apparent to a person of ordinary skill in the art after having read the foregoing description. It is to be understood that the particular embodiments shown and described by way of illustration are in no way intended to be considered limiting. The foregoing examples have been provided merely for the purpose of explanation and are in no way to be construed as limiting. It is understood that the words, which have been used herein, are words of description and illustration, rather than words of limitation. Although the invention has been described herein with reference to particular means, materials and embodiments, the invention is not intended to be limited to the particulars disclosed herein; rather, the invention extends to all functionally equivalent structures, methods and uses that are within the scope of the appended claims.

What is claimed is:

1. A method of automatically or semi-automatically selecting well logging or testing measurements and/or their respective control parameters based on an objective function having predetermined sensitivities to a multitude of uncertainties associated with input variables to a model, comprising providing at least one processor to conduct the steps of:
   ranking measurements and/or control parameters in accordance with their capability to reduce the uncertainties of input variables identified as most sensitive input variables through simulations using the model or a reduced variant of the model;
   using the ranked measurements and/or control parameters to automatically or semi-automatically select the ones reducing at most the uncertainties of input variables identified as most sensitive input variables.

2. The method of claim 1 wherein the measurements and control parameters are ranked by comparing the sensitivities to a multitude of uncertainties associated with input variables to a model for the objective function with the sensitivities to a multitude of uncertainties associated with input variables to a model for the result of the measurements.

3. The method of claim 1 wherein the measurements and control parameters are selected from known logging and well testing measurements and their respective control parameters.

4. The method of claim 1 wherein the objective function is derived from a field development plan of a hydrocarbon reservoir.

5. The method of claim 1 wherein the model includes a model of a hydrocarbon reservoir.

6. The method of claim 1 wherein the predetermined sensitivities are calculated by varying the input parameters within their respective range of uncertainty.

7. The method of claim 6 wherein the ranking is further constrained by external variables comprising one or more of cost, time, safety, or availability.

8. The method of claim 1 wherein the predetermined sensitivities are calculated by varying the input parameters within their respective range of uncertainty and determining the corresponding variation of the objective function.

9. The method of claim 1 wherein the ranking is determined by the best matching sensitivities.

10. A method of performing a logging or testing measurement comprising the step of mobilizing one or more measurement tools capable of performing the logging or testing measurement at a well site after having automatically or semi-automatically selected the logging or testing measurement and/or their respective control parameters based on an objective function having predetermined sensitivities to a multitude of uncertainties associated with input variables to a model, wherein the measurements and/or control parameters are ranked in accordance with their capability to reduce the uncertainties of input variables identified as most sensitive input variables through simulations using the model or a reduced variant of the model and the ranked measurements and/or the control parameters are used to automatically or semi-automatically select the ones reducing at most the uncertainties of input variables identified as most sensitive input variables.

11. A method of logging or testing an earth formation reservoir comprising the step of:

automatically or semi-automatically selecting logging or testing measurement based on an objective function having predetermined sensitivities to a multitude of uncertainties associated with input variables to a model, wherein at least one processor conducts the steps of ranking measurements and/or control parameters in accordance with their capability to reduce the uncertainties of input variables identified as most sensitive input variables through simulations using the model or a reduced variant of the model;

using the ranked measurements and/or control parameters to automatically or semi-automatically select the ones reducing at most the uncertainties of input variables identified as most sensitive input variables; and mobilizing one or more measurement tools capable of performing the selected logging or testing measurement of the earth formation reservoir.

* * * * *